(12) United States Patent
Yasuhara et al.

(10) Patent No.: US 9,064,696 B2
(45) Date of Patent: Jun. 23, 2015

(54) APPARATUS FOR MANUFACTURING COMPOUND SEMICONDUCTOR, METHOD FOR MANUFACTURING COMPOUND SEMICONDUCTOR, AND COMPOUND SEMICONDUCTOR

(75) Inventors: Hideki Yasuhara, Kawasaki (JP); Akira Bandoh, Chichibu (JP)

(73) Assignee: TOYODA GOSEI CO., LTD., Aichi (JP)

(*) Notice: Subject to any disclaimer, the term of this patent is extended or adjusted under 35 U.S.C. 154(b) by 0 days.

(21) Appl. No.: 13/817,388

(22) PCT Filed: Aug. 16, 2011

(86) PCT No.: PCT/JP2011/068562
§ 371 (c)(1),
(2), (4) Date: Feb. 15, 2013

(87) PCT Pub. No.: WO2012/023557
PCT Pub. Date: Feb. 23, 2012

(65) Prior Publication Data
US 2013/0143393 A1    Jun. 6, 2013

(30) Foreign Application Priority Data

Aug. 20, 2010 (JP) ................. 2010-184775

(51) Int. Cl.
*H01L 21/20* (2006.01)
*H01L 21/02* (2006.01)
(Continued)

(52) U.S. Cl.
CPC ...... *H01L 21/02293* (2013.01); *C23C 16/4583* (2013.01); *C30B 25/12* (2013.01);
(Continued)

(58) Field of Classification Search
CPC ............ H01L 21/022; H01L 21/02293; H01L 21/02241; H01L 21/0262; H01L 21/02532; H01L 21/6875; H01L 21/68764; C23C 16/4583; C03B 25/12

USPC ............. 438/478, 357, 22; 118/58, 722, 724, 118/725; 219/390; 156/345.52
See application file for complete search history.

(56) References Cited

U.S. PATENT DOCUMENTS 6,528,767 B2* 3/2003 Bagley et al. ............. 219/390
8,153,454 B2* 4/2012 Ueno et al. ................ 438/22
(Continued)

FOREIGN PATENT DOCUMENTS

JP    7-58039 A    3/1995
JP    7-58041 A    3/1995
(Continued)

*Primary Examiner* — Charles Garber
*Assistant Examiner* — Syed Gheyas
(74) *Attorney, Agent, or Firm* — Sughrue Mion, PLLC

(57) ABSTRACT

Provided is an apparatus for manufacturing a compound semiconductor, which forms a compound semiconductor layer using a metal-organic chemical vapor deposition method. The apparatus is characterized in that: the apparatus is provided with a reaction container, a holder, which is disposed in the reaction container and has placed thereon a subject, on which the layer is to be formed, the subject having facing up the subject surface where the layer is to be formed, and a raw material supply port, through which the raw material gas of the compound semiconductor is supplied to the inside of the reaction container from the outside; the holder is in contact with the lower surface of the subject, the contact being inside of the outer circumferential portion of the subject to the center of the upper surface of the holder; and that the holder has a supporting portion, which supports the subject such that a predetermined interval is maintained between the upper surface of the holder and the lower surface of the subject. In the manufacture of the compound semiconductor using the MOCVD method, temperature distribution on the substrate surface to be deposited with a compound semiconductor crystal, and deviation of in-plane averaged light emission wavelength from a target value are suppressed using the apparatus.

16 Claims, 9 Drawing Sheets

(51) Int. Cl.
  *C23C 16/458* (2006.01)
  *C30B 25/12* (2006.01)
  *H01L 21/687* (2006.01)
  *C30B 25/02* (2006.01)
  *C30B 29/40* (2006.01)
  *H01L 33/00* (2010.01)

(52) U.S. Cl.
  CPC ........ *H01L21/0237* (2013.01); *H01L 21/0242* (2013.01); *H01L 21/02458* (2013.01); *H01L 21/0254* (2013.01); *H01L 21/02573* (2013.01); *H01L 21/0262* (2013.01); *H01L 21/6875* (2013.01); *H01L 21/68757* (2013.01); *H01L 21/68764* (2013.01); *H01L 21/68771* (2013.01); *H01L 33/007* (2013.01); *C30B 25/02* (2013.01); *C30B 29/403* (2013.01)

(56) References Cited

U.S. PATENT DOCUMENTS

| | | | |
|---|---|---|---|
| 8,324,063 B2* | 12/2012 | Fujikawa et al. | 438/357 |
| 2003/0164362 A1 | 9/2003 | Bagley et al. | |
| 2006/0090855 A1* | 5/2006 | Kimura | 156/345.52 |
| 2009/0007841 A1* | 1/2009 | Hirata et al. | 117/84 |
| 2009/0075409 A1 | 3/2009 | Ueno et al. | |
| 2010/0227455 A1 | 9/2010 | Fujikawa et al. | |

FOREIGN PATENT DOCUMENTS

| | | |
|---|---|---|
| JP | 2004-103708 A | 4/2004 |
| JP | 2005-509275 A | 4/2005 |
| JP | 2006-156938 A | 6/2006 |
| JP | 2009-71122 A | 4/2009 |
| JP | 2010-80614 A | 4/2010 |
| WO | 2009/060912 A1 | 5/2009 |

* cited by examiner

APPARATUS FOR MANUFACTURING COMPOUND SEMICONDUCTOR, METHOD FOR MANUFACTURING COMPOUND SEMICONDUCTOR, AND COMPOUND SEMICONDUCTOR

CROSS REFERENCE TO RELATED APPLICATIONS

This application is a National Stage of International Application No. PCT/JP2011/068562 filed Aug. 16, 2011, claiming priority based on Japanese Patent Application No. 2010-184775 filed Aug. 20, 2010, the contents of all of which are incorporated herein by reference in their entirety.

TECHNICAL FIELD

The present invention relates to an apparatus for manufacturing a compound semiconductor, a method for manufacturing a compound semiconductor, and a compound semiconductor.

BACKGROUND ART

Conventionally, as one of the methods for growing compound semiconductor crystals, a metal-organic chemical vapor deposition method (hereinafter, referred to as an MOCVD method) is known. As an apparatus for manufacturing a compound semiconductor, for example, an apparatus is described in Patent Document 1, in which, inside a reaction tube into which a raw material gas is supplied, plural substrates on which compound semiconductor crystals are to be grown are placed on a holder made of SiC so that a growth surface of each crystal faces upwardly, and crystal growth is executed by rotating the holder to rotate the substrates.

CITATION LIST

Patent Literature

Patent Document 1: Japanese Patent Application Laid-Open Publication No. 2004-103708

SUMMARY OF INVENTION

Technical Problem

In an apparatus for manufacturing a compound semiconductor using the MOCVD method, a sapphire substrate or the like is placed on a holder called a satellite disc or a wafer carrier (hereinafter, collectively referred to as a satellite disc). Then, crystals of a compound semiconductor generated by reaction of a raw material gas infused into the apparatus are epitaxially grown on the sapphire substrate that is heated through the satellite disc.

In this case, a method for placing the sapphire substrate on a predetermined support member so that the satellite disc and the sapphire substrate are not in direct contact with each other is adopted.

However, there are some cases in which temperature difference occurs on a surface of the sapphire substrate depending upon a position or shape of the support member that supports the sapphire substrate, and thereby uniformity in crystal growth of the compound semiconductor is deteriorated. In addition, a similar problem occurs by warping of a wafer caused in the process of growth of the sapphire substrate and a compound semiconductor layer.

An object of the present invention is, in manufacture of a compound semiconductor using the MOCVD method, to suppress deviation of an average wavelength in a plane of a wafer from a target value thereof due to changes in temperature distribution and warping of a substrate surface on which a crystal of the compound semiconductor is grown. This reduces variation in quality of a semiconductor thin film, and therefore, for example, in the case of a light emitting element, uniformity in characteristics of light emission wavelength and light emission output is improved, and improvement in yield can be expected.

Solution to Problem

According to the present invention, an apparatus for manufacturing a compound semiconductor, a method for manufacturing a compound semiconductor and a compound semiconductor according to the following first to seventeenth aspects are provided.

According to a first aspect of the present invention, there is provided an apparatus for manufacturing a compound semiconductor that forms a layer of the compound semiconductor using a metal-organic chemical vapor deposition method, the apparatus including: a reaction container; a holder that is placed in the reaction container, on which a forming body is placed so that a forming surface of the forming body faces upward; and a raw material supply port that supplies a raw material gas into the reaction container from outside. The holder includes a support portion that contacts a lower surface of the forming body at an inner side of an outer circumferential portion of the forming body to a center of a top surface of the holder and supports the forming body so that the top surface of the holder and the lower surface of the forming body maintains a predetermined space.

According to a second aspect of the present invention, in the apparatus for manufacturing a compound semiconductor of the first aspect, the support portion is formed at a position between concentric circles with radii ($R_1$) of 0.5 to 0.9 times an effective radius $R_0$ of the forming body from the center of the top surface of the holder.

According to a third aspect of the present invention, in the apparatus for manufacturing a compound semiconductor of the first or second aspect, the support portion is provided at a position between concentric circles with radii of 0.6 to 0.8 times an effective radius $R_0$ of the forming body from the center of the top surface of the holder.

According to a fourth aspect of the present invention, in the apparatus for manufacturing a compound semiconductor of any one of the first to third aspects, the support portion includes protrusions provided at least at three points on the top surface of the holder.

According to a fifth aspect of the present invention, in the apparatus for manufacturing a compound semiconductor of the fourth aspect, a groove part is formed around each of the protrusions provided on the top surface of the holder.

According to a sixth aspect of the present invention, in the apparatus for manufacturing a compound semiconductor of any one of the first to fifth aspects, a contact area between the support portion and the forming body is 1% or less of an area of the forming body.

According to a seventh aspect of the present invention, in the apparatus for manufacturing a compound semiconductor of any one of the first to third aspects, the support portion includes a ring shape formed on the top surface of the holder.

According to an eighth aspect of the present invention, in the apparatus for manufacturing a compound semiconductor of the seventh aspect, a groove part is formed on each of an inner circumferential side and an outer circumferential side of the ring-shaped support portion provided on the top surface of the holder.

According to a ninth aspect of the present invention, in the apparatus for manufacturing a compound semiconductor of any one of the first to seventh aspects, the support portion is made of a material having a thermal conductivity of 10 W/(m·K) or less at growth temperature.

According to a tenth aspect of the present invention, in the apparatus for manufacturing a compound semiconductor of any one of the first to ninth aspects, the support portion is made of one material selected from a group constituted by alumina ($Al_2O_3$), quartz glass ($SiO_2$), silicon nitride ($Si_3N_4$), zirconia ($ZrO_2$) and silicon carbide (SiC).

According to an eleventh aspect of the present invention, in the apparatus for manufacturing a compound semiconductor of any one of the first to ninth aspects, the support portion is made of sapphire.

According to a twelfth aspect of the present invention, in the apparatus for manufacturing a compound semiconductor of any one of the first to eleventh aspects, the compound semiconductor is a group III nitride semiconductor.

According to a thirteenth aspect of the present invention, there is provided a method for manufacturing a compound semiconductor that forms layers of the compound semiconductor on a forming surface of a forming body in a reaction container by epitaxial growth using a metal-organic chemical vapor deposition method, the method for manufacturing a compound semiconductor including: providing a support portion on a holder, which contacts a lower surface of the forming body at an inner side of an outer circumferential portion of the forming body to a center of a top surface of the holder and supports the forming body, so that the top surface of the holder and the lower surface of the forming body maintains a predetermined space, and placing the forming body so that the forming surface of the forming body faces upward and the lower surface of the forming body does not contact the top surface of the holder; setting the holder on which the forming body is placed in the reaction container rotatably; and supplying a raw material gas for the compound semiconductor into the reaction container in which the holder is set.

According to a fourteenth aspect of the present invention, in the method for manufacturing a compound semiconductor of the thirteenth aspect, the forming body is placed on the support portion having protrusion shapes provided at least at three points between concentric circles with radii ($R_1$) of 0.5 to 0.9 times an effective radius $R_0$ of the forming body from the center of the top surface of the holder.

According to a fifteenth aspect of the present invention, in the method for manufacturing a compound semiconductor of the thirteenth or fourteenth aspect, the forming body is heated to 700° C. or more to 1200° C. or less.

According to a sixteenth aspect of the present invention, in the method for manufacturing a compound semiconductor of any one of the thirteenth to fifteenth aspects, the compound semiconductor is a group III nitride semiconductor.

According to a seventeenth aspect of the present invention, there is provided a compound semiconductor manufactured by the method for manufacturing a compound semiconductor according to any one of the thirteenth to sixteenth aspects.

Advantageous Effects of Invention

According to the present invention, in an apparatus for manufacturing a compound semiconductor or a method for manufacturing a compound semiconductor according to an MOCVD method, temperature distribution of the substrate surface is suppressed compared to a case where a substrate on which a crystal of compound semiconductor is to be grown is directly placed on a holder (satellite disc). Consequently, uniformity in crystal growth of the compound semiconductor is improved, and a standard deviation (σ) of the light emission wavelength in a plane of a wafer where a light emitting layer is formed (in a plane of a laminated semiconductor wafer) is reduced.

Moreover, compared to the case where the substrate is directly placed on the satellite disc, the temperature distribution of the substrate surface is suppressed even though warping occurs in the substrate. Further, since a contact area between the substrate and the satellite disc is small, non-uniformity in temperature caused by variation in the contact area hardly occurs.

DESCRIPTION OF EMBODIMENTS

Hereinafter, an exemplary embodiment according to the present invention will be described in detail. It should be noted that the present invention is not limited to the following exemplary embodiment, but may be practiced as various modifications within the scope of the gist of the invention. Further, each of the figures to be used indicates an example for illustration of the exemplary embodiment, and does not represent an actual size thereof.

<MOCVD Apparatus>

Figure 1:
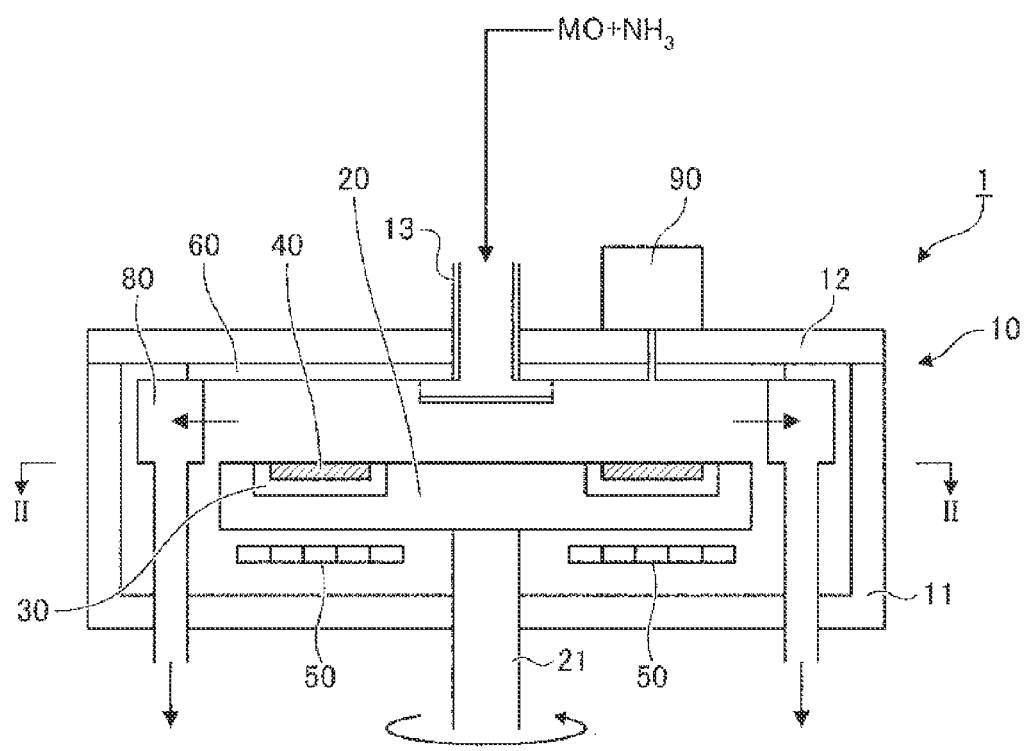
FIG. 1 is an example of a schematic view showing a sectional configuration of an MOCVD (metal-organic chemical vapor deposition) apparatus.
Figure 2:
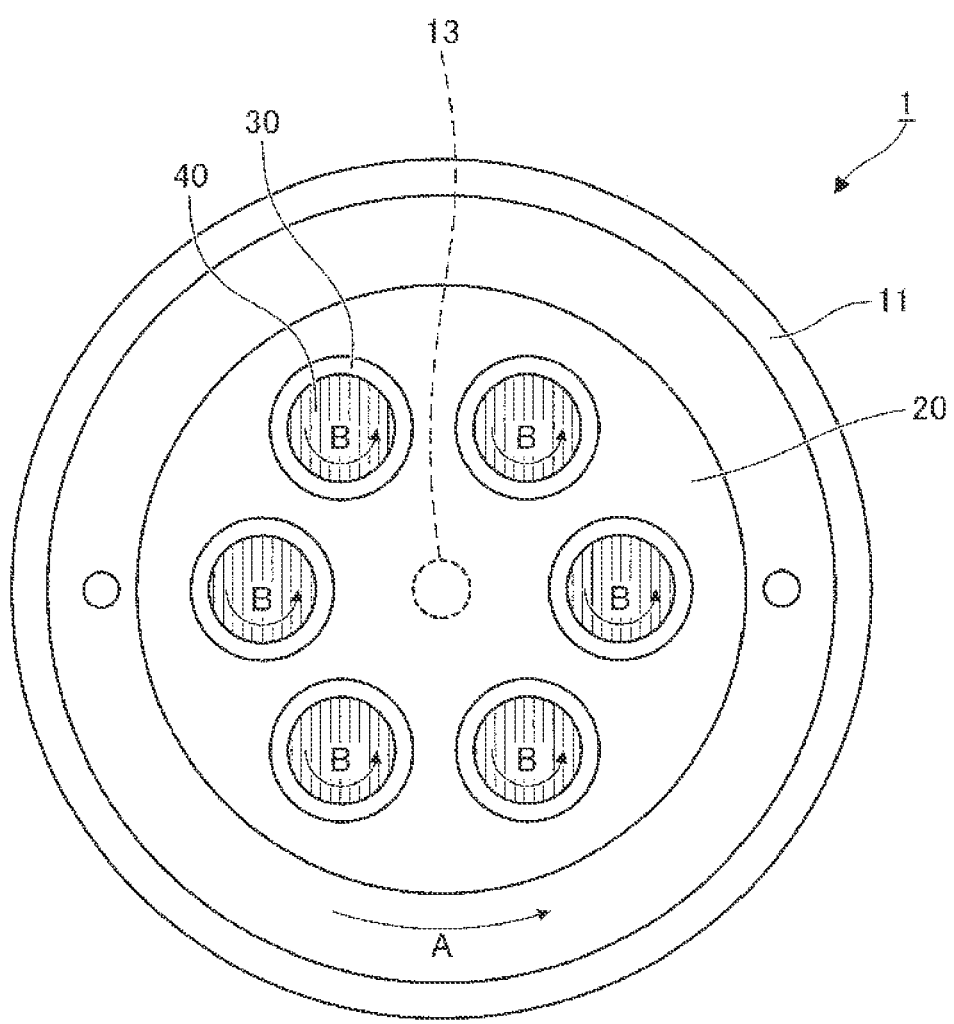
FIG. 2 is a plan view of the MOCVD apparatus shown in FIG. 1 as viewed from the II-II cross section.

FIG. 1 is a diagram showing a sectional configuration of an MOCVD (metal-organic chemical vapor deposition) apparatus 1. FIG. 2 is a II-II cross-sectional view of the MOCVD apparatus 1 shown in FIG. 1.

For the MOCVD apparatus 1, for example, a substrate 110 for epitaxially growing a crystal of a group III nitride semiconductor (refer to FIG. 5 to be described later) or a compound semiconductor substrate made by further forming at least one compound semiconductor layer having arbitrary composition in advance thereon (as an example, a compound semiconductor substrate 40 to be described later can be provided, and in the specification, these are also referred to as a forming body) can be arbitrarily selected. For example, in the case of using the compound semiconductor substrate 40, a so-called vertical configuration is provided in which the compound semiconductor 40 is arranged so that a crystal growth plane thereof faces upward and a raw material gas to be a raw material of the crystal to be eptaxially grown is supplied from above the compound semiconductor 40.

The MOCVD apparatus 1 includes a reaction container 10 in which a reaction chamber is formed and a support body 20 arranged in the reaction chamber of the reaction container 10. The reaction container 10 includes an aperture formed to have a cylindrical shape and to be opened toward upper side, and inside thereof, includes a container portion 11 that contains the support body 20 and a lid portion 12 that has a shape of a circular plate and is attached to an upper part of the container portion 11.

The container portion 11 and the lid portion 12 are configured with metal such as a stainless steel. In addition, the lid portion 12 is attached to the container portion 11 to be openable and closable, and in the case of closing the container portion 11, forms the reaction chamber together with the container portion 11. It should be noted that a not shown sealing member such as an O-ring is attached to a location where the container portion 11 and the lid portion 12 face each other.

At a center part of the lid portion 12, a through hole for supplying a raw material gas from a gas supply mechanism (not shown) provided outside to the inside of the reaction chamber is formed. A supply tube 13 is connected to the through hole. At a position deviated from the center part of the lid portion 12, a through hole for observing the inside of the reaction chamber is also formed.

In a bottom surface of the container portion 11, plural exhaust tubes for ejecting the raw material gas supplied into the reaction chamber to the outside of the reaction chamber are formed through the bottom surface. At a center part of the bottom surface of the container portion 11, a through hole for passing a shaft 21 to be described later is formed.

The support body 20 has a circular shape, and is placed in the container portion 11 so that one surface (front surface) thereof faces upward and the other surface (back surface) faces downward. The support body 20 is configured with a base material formed of carbon (C) and a coating by silicon carbide (SiC) applied to the outside thereof. On the front surface side of the support body 20, six recessed portions each of which has a circular shape are formed at same intervals in the circumferential direction. On the back surface side of the support body 20, a shaft 21 made of metal is attached downwardly from the center part thereof. The shaft 21 protrudes to the outside of the reaction container 10 via the through hole provided at the center part of the bottom surface of the container portion 11. The support body 20 is configured to rotate in the direction of arrow A in FIG. 2 by applying a driving force to the shaft 21 from the outside. Inside the support body 20, a gas supply port (not shown) for supplying nitrogen ($N_2$) toward the bottom surfaces of the six recessed portions provided in the support body 20 is formed.

In each of the six recessed portions provided on the front surface of the support body 20, a substrate holder 30 as an example of a holder having a circular shape is attached. In each substrate holder 30, a circular-shaped recessed portion is formed on a surface facing upward, and in each recessed portion, the compound semiconductor substrate 40 is attached. A gap is formed between the recessed portion provided in the support body 20 and the substrate holder 30, and these six substrate holders 30 are detachably attached to the support body 20.

The compound semiconductor substrate 40 as an example of the forming body is held at the recessed portion of the substrate holder 30 so that a crystal growth surface thereof (surface on which the crystal is to be grown) is exposed to the outside. The compound semiconductor substrate 40 is detachably attached to the substrate holder 30. Each substrate holder 30 is configured to rotate in the direction of arrow B in FIG. 2 by a flow of nitrogen ($N_2$) supplied via a not-shown through hole while each being in a state of holding the compound semiconductor substrate 40.

Between the back surface side of the support body 20 and the bottom surface of the container portion 11 of the MOCVD apparatus 1, a heater portion 50 is provided. The heater portion 50 heats the compound semiconductor substrate 40 through the support body 20 and the substrate holder 30. The heater portion 50 has a ring shape in which a hole for passing the shaft 21 is formed, and a coil is contained inside thereof. The heater portion 50 performs electromagnetic induction heating on the carbon constituting the support body 20 by supplying an electric current to the coil.

A protecting member 60 is provided below the lid portion 12 and above the support body 20 of the MOCVD apparatus 1. The protecting member 60 protects the lid portion 12 by preventing a product produced by reaction of the raw material gas supplied to the reaction chamber from attaching to and depositing on an inner wall of the lid portion 12. The protecting member 60 has a circular shape, and similar to the lid portion 12, a through hole for supplying the raw material gas from the outside to the inside of the reaction chamber is formed at the center part thereof. Similar to the lid portion 12, also, a through hole for observing the inside of the reaction chamber from the outside is formed in the protecting member 60.

Between the support body 20 and the protecting member 60 of the MOCVD apparatus 1, an exhaust member 80 is attached. The exhaust member 80 guides the raw material gas or the like that has been supplied to the reaction chamber and used for epitaxial growth of crystal toward the exhaust tubes provided on the bottom surface of the container portion 11. The exhaust member 80 has a ring-like shape. An inner wall of the exhaust member 80 is positioned at the outer side of the six recessed portions provided in the support body 20. On the inner wall of the exhaust member 80, plural through holes (not shown) for ejecting the raw material gas or the like after using to the outside are formed. The exhaust member 80 is configured not to hinder the rotation of the support body 20 at a location facing the peripheral end side of the outer circumferential portion of the support body 20. In FIG. 2, illustration of the exhaust member 80 is omitted.

Above the through hole provided to the lid portion 12 of the MOCVD apparatus 1, a monitoring device 90 is attached. Via each of the through holes provided to the lid portion 12 and the protecting member 60, the monitoring device 90 monitors the status inside the reaction chamber, and specifically, monitors the status of crystal epitaxially growing on the compound semiconductor substrate 40 held by the support body 20 via the substrate holder 30, the status of warping in the compound semiconductor substrate 40, or the like. It should be noted that, for preventing the raw material gas or the like from flowing into the monitoring device 90 via the through hole, for example, a purge gas such as nitrogen ($N_2$) is supplied from the monitoring device 90 toward the reaction chamber.

<Substrate Holder>

Figure 3A:
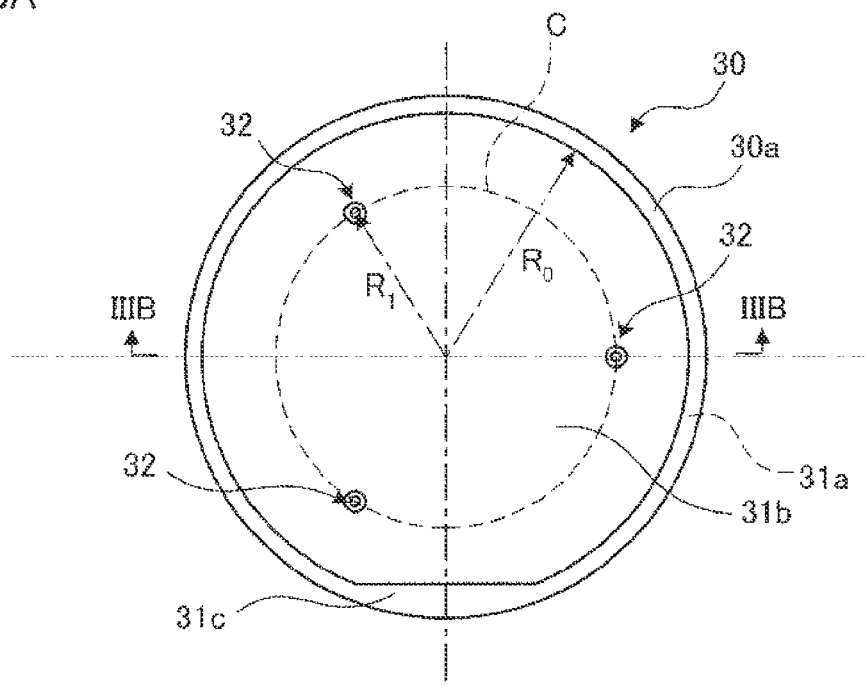
FIG. 3A is a top view of a substrate holder having three protrusion-shaped support portions.
Figure 3B:
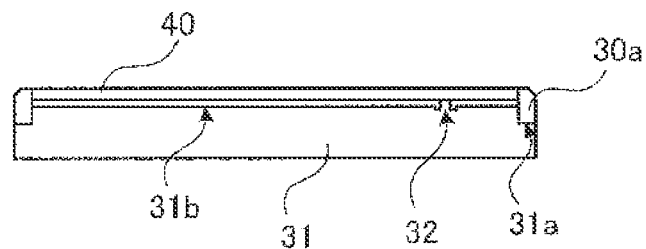
FIG. 3B is a IIIB-IIIB cross-sectional view of FIG. 3A in a case of placing a compound semiconductor substrate thereon.
Figure 3C:
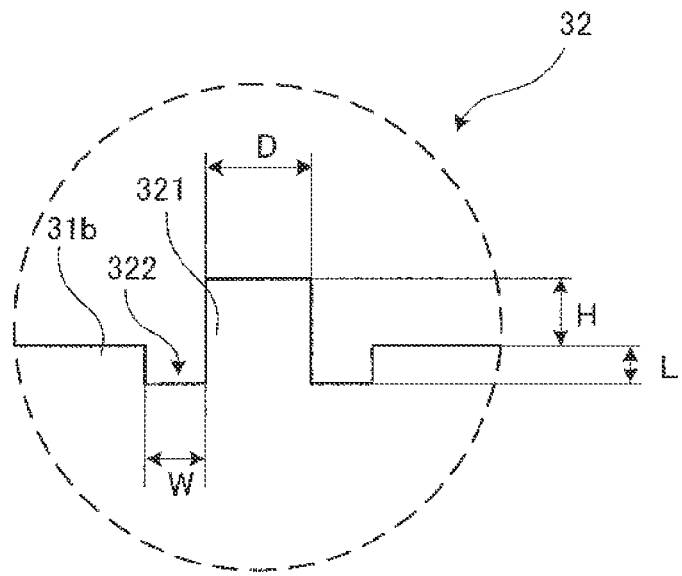
FIG. 3C is an enlarged cross-sectional view of the support portion in FIG. 3B.

FIG. 3 shows diagrams illustrating a configuration of the substrate holder 30 used in the above-described MOCVD apparatus 1. FIG. 3A is a top view of the substrate holder 30 having three protrusion-shaped support portions 32, FIG. 3B is a IIIB-IIIB cross-sectional view of FIG. 3A in the case of placing the compound semiconductor substrate 40 thereon, and FIG. 3C is an enlarged cross-sectional view of the support portion 32 in FIG. 3B.

As shown in FIGS. 3A and 3B, the substrate holder 30 as an example of a holder includes a main body portion 31 having a circular shape and a ring 30a put into a limb portion 31a of the main body portion 31. On a top surface of the main body portion 31, a flat center portion 31b is formed. The diameter of the center portion 31b is set slightly larger than the diameter of the compound semiconductor substrate 40, as a forming body, to be described later. Moreover, a part of the arc-shaped limb portion 31a is formed linearly so as to correspond to an orientation flat (hereinafter, referred to as "ori-fla") of the compound semiconductor substrate 40 as the forming body (ori-fla corresponding portion 31c). In the exemplary embodiment, the main body portion 31 is configured with graphite coated with silicon carbide (SiC). It should be noted that a covering portion configured with silicon nitride ($Si_3N_4$) may be provided on a side surface of an outer side in the circumferential direction and on a back surface side of the main body portion 31.

On the center portion 31b of the main body portion 31, three protrusion-shaped support portions 32 are formed. The three support portions 32 are arranged on a circumference of a circle C at a radius of $R_1$ from the center of the top surface of the main body portion 31 while keeping substantially the same intervals along the circumference. The radius $R_1$ of the circle C on which the support portions 32 are arranged is shorter than an effective radius $R_0$ of the compound semiconductor substrate 40 to be described later ($R_1 < R_0$). Here, the effective radius $R_0$ refers to a radius of the circular part other than the orientation flat of the compound semiconductor substrate 40.

The effective radius $R_0$ of the compound semiconductor substrate 40 used in the exemplary embodiment is not particularly limited. Normally, the effective radius $R_0$ is in the range of 25 mm to 150 mm. At this time, the radius $R_1$ of the circle C on which the three support portions 32 are arranged is normally in the range of 12 mm to 135 mm. In the exemplary embodiment, the larger aperture diameter of 100 mm or more of the effective radius ($R_0$) of the compound semiconductor substrate 40 is desirable because more remarkable effect is produced. On the other hand, as a material constituting the compound semiconductor substrate 40, for example, sapphire is preferable. Sapphire has low thermal conductivity compared to silicon, gallium arsenide or the like, and has wide temperature distribution to produce a remarkable effect; therefore, it is preferable.

Further, in the exemplary embodiment, the relation between the radius $R_1$ of the circle C on which the support portions 32 are arranged and the effective radius $R_0$ of the compound semiconductor substrate 40 is desirably ($R_1 = 0.5 \times R_0$ to $0.9 \times R_0$), more desirably ($R_1 = 0.6 \times R_0$ to $0.8 \times R_0$), and most desirably ($R_1 = 0.65 \times R_0$ to $0.75 \times R_0$). If the radius $R_1$ of the circle C is more than 90% of the effective radius $R_0$, the deviation in the distance between the main body portion 31 and the compound semiconductor substrate 40 becomes larger due to an effect of warping, and there is a tendency to generate temperature distribution. On the other hand, in a case where the radius $R_1$ of the circle C is less than 50% of the effective radius $R_0$, there occur some cases in which the compound semiconductor substrate 40 cannot be supported stably. In addition, if the compound semiconductor substrate 40 is tilted by rotation of the compound semiconductor substrate 40 or flow of the gas, the possibility that temperature distribution becomes wider increases.

By placing the compound semiconductor substrate 40 on the three support portions 32 arranged on the circumference of the circle C near the radius $R_1 = 0.7 \times R_0$ from the center of the top surface of the main body portion 31, even though warping of the compound semiconductor substrate 40 is changed, an average temperature in a wafer plane, which is an epitaxial growth surface of crystal, is maintained constant. As a result, an average value of light emission wavelength in a wafer plane in which a light emitting layer is formed (in a laminated semiconductor wafer plane) is maintained constant. This is because an average value of the gap between the substrate holder 30 and the back surface of the wafer is maintained constant independent of the warp of the wafer.

As shown in FIG. 3B, the compound semiconductor substrate 40 placed on the substrate holder 30 is supported by the three support portions 32 so that the top surface of the center portion 31b of the main body portion 31 and a lower surface of the compound semiconductor substrate 40 are not in contact with each other. In addition, an outer circumferential side surface of the compound semiconductor substrate 40 is brought into contact with the ring 30a configured with a low thermal conduction member, and therefore, thermal transfer thereto from the main body portion 31 is reduced.

As shown in FIG. 3C, the protrusion-shaped support portion 32 includes a protruding part 321 having a predetermined height H from the top surface of the center portion 31b, and around the protruding part 321, a groove part 322 is formed to have a predetermined depth L from the top surface of the center portion 31b.

In the exemplary embodiment, the height H of the protruding part 321 is not particularly limited; however, H is normally in the range of 0.05 mm to 1 mm, and preferably in the range of 0.1 mm to 0.5 mm. If the height H of the protruding part 321 is excessively high, it is necessary to make the temperature of the substrate holder 30 higher for maintaining the surface temperature of the compound semiconductor substrate 40 at a predetermined temperature, and thereby problems occur in terms of increase of the electric load or heat resistance.

Moreover, for example, in a case where the epitaxial growth of crystal is low-temperature growth of less than 700° C., it becomes possible to make the height H of the protruding part 321 higher. In a case where the height H of the protruding part 321 is excessively low, it is undesirable because there is a possibility that the compound semiconductor substrate 40 contacts the substrate holder 30 because of warping, and thereby temperature non-uniformity is generated.

The depth L of the groove part 322 is not particularly limited, but is in the range of 0.05 mm to 2.5 mm, and preferably in the range of 0.2 mm to 1.5 mm.

It should be noted that it is preferable to configure the diameter D of the protruding part 321 so that a contact area between the lower surface of the compound semiconductor substrate 40 and the protruding part 321 becomes small. In consideration of the material of the protruding part 321, deterioration and processing accuracy, the diameter D of the protruding part 321 is normally in the range of 0.3 mm to 3 mm, and preferably in the range of 0.5 mm to 2 mm. In addition, a width W of the groove part 322 is normally in the range of 0.5 mm to 5 mm, and preferably in the range of 0.7 mm to 3 mm.

Moreover, the cross-sectional shape of the protruding part 321 is not particularly limited, and for example, a circle, a triangle, a quadrangle, an ellipse or the like can be provided. Similarly, the cross-sectional shape of the groove part 322 is not particularly limited, too, and for example, a rectangle, a semi-circle, a half-ellipse, a trapezoid, a triangle or the like can also be used. Further, the shape of the contact area between the protruding part 321 and the compound semiconductor substrate 40 is not particularly limited, and for example, a flat surface, a curved surface or the like can be provided.

In the exemplary embodiment, the support portions 32 may be formed separately from the main body portion 31 of the substrate holder 30. For example, the protrusion-shaped support portions 32 may be set in the main body portion 31. In this case, division of the support portions 32 and the main body portion 31 reduces thermal conductivity, to further suppress thermal conduction between the compound semiconductor substrate 40 and the substrate holder 30.

In addition, the support portions 32 may be configured with a material different from that of the main body portion 31. In this case, it is preferable that the material constituting the support portions 32 has the thermal conductivity of 10 W/(m·K) or less at a temperature for performing epitaxial growth on the compound semiconductor substrate 40. As a specific material, for example, alumina ($Al_2O_3$), silicon nitride ($Si_3N_4$), quartz glass ($SiO_2$), zirconia ($ZrO_2$) or the like may be provided. Of these, quartz glass ($SiO_2$) or zirconia ($ZrO_2$) has particularly law thermal conductivity, and thereby it becomes possible to suppress thermal conductance between the compound semiconductor substrate 40 and the main body portion 31.

In the exemplary embodiment, as described above, by supporting three points on an inner circumferential side of the compound semiconductor substrate 40 by the protrusion-shaped support portions 32, the compound semiconductor substrate 40 is placed on the substrate holder 30 without contacting the top surface of the center portion 31*b*. Consequently, the contact area between the compound semiconductor substrate 40 and the substrate holder 30 is reduced, and thereby thermal conduction between the compound semiconductor substrate 40 and the substrate holder 30 is suppressed.

Moreover, temperature changes owing to non-uniformity in the contact state caused by warping of the compound semiconductor substrate 40 are suppressed. It is preferable that the contact area between the compound semiconductor substrate 40 and the substrate holder 30 is 1% or less of the area of the compound semiconductor substrate 40. In this case, the effect due to the contact between the compound semiconductor substrate 40 and the substrate holder 30 is reduced, and thereby uniformity in temperature is increased.

In addition, by configuring the protrusion-shaped support portions 32 with a low thermal conduction material and providing the groove part 322 around the support portions 32, thermal conduction in the vicinity of the support portions 32 between the compound semiconductor substrate 40 and the substrate holder 30 is suppressed, to thereby reduce the effect of the support portions 32.

(Second Embodiment of Substrate Holder 30)

Figure 4A:
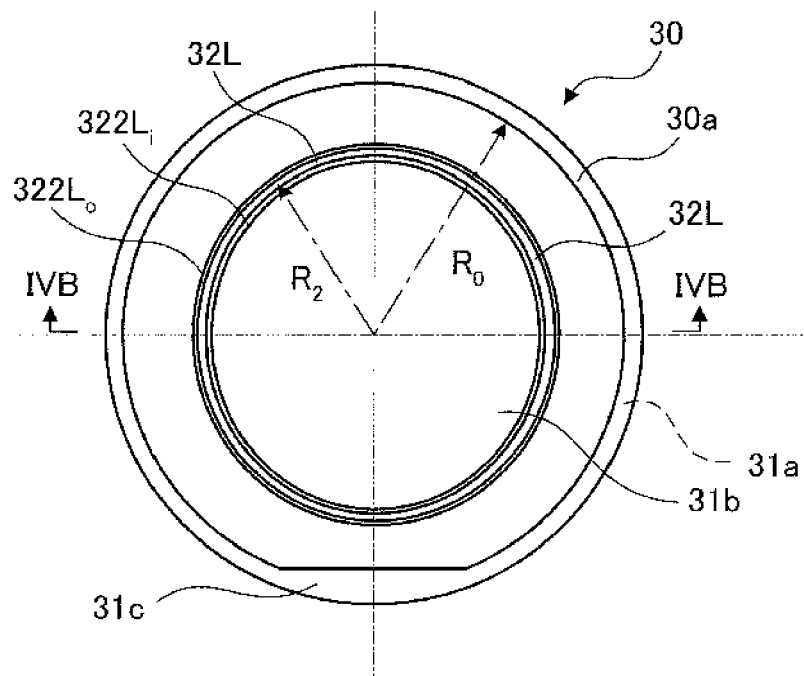
FIG. 4A is a top view of a substrate holder having a ring-shaped support portion.
Figure 4B:
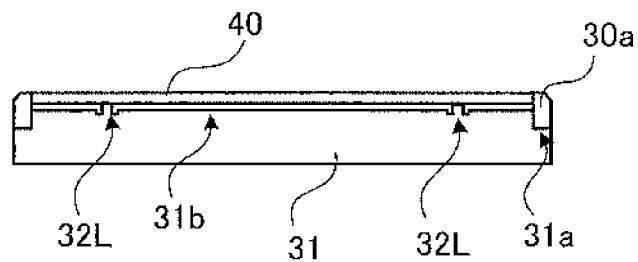
FIG. 4B is a IVB-IVB cross-sectional view of FIG. 4A in a case of placing a compound semiconductor substrate thereon.

FIG. 4 shows diagrams illustrating a second embodiment of the substrate holder 30 used in the above-described MOCVD apparatus 1. FIG. 4A is a top view of the substrate holder having a ring-shaped support portion, and FIG. 4B is a IVB-IVB cross-sectional view of FIG. 4A in a case of placing the compound semiconductor substrate 40 thereon. Same symbols are assigned to configurations same as those in FIG. 3, and description thereof will be omitted.

As shown in FIG. 4A, a ring-shaped support portion 32L is formed in the center portion 31*b* of the main body portion 31. The ring-shaped support portion 32L is arranged on a circumference of a circle having a radius $R_2$ from the center of the top surface of the main body portion 31. Moreover, on an outer circumferential side and an inner circumferential side of the ring-shaped support portion 32L, groove parts 322Lo and 322Li are formed, respectively, so as to have a predetermined difference in level from the top surface of the center portion 31*b*.

The radius $R_2$ of the circle on which the support portion 32L is arranged is shorter than the effective radius $R_0$ of the compound semiconductor substrate 40 ($R_2<R_0$). Similar to the exemplary embodiment shown in FIG. 3, it is preferable that the relation between the radius $R_2$ of the circle on which the support portion 32 is arranged and the effective radius $R_0$ of the compound semiconductor substrate 40 is similar to that of $R_1$. By placing the compound semiconductor substrate 40 on the support portion 32L arranged on the circle having the radius $R_2$ from the center of the top surface of the main body portion 31, even though warping of the compound semiconductor substrate 40 is changed, changes in average temperature in an epitaxial growth surface of crystal is suppressed, and thereby deviation of an average value of light emission wavelength in the wafer plane in which the light emitting layer from a target value is suppressed.

As shown in FIG. 4B, by supporting the compound semiconductor substrate 40 by the ring-shaped support portion 32L provided at a position of a length from the center of the top surface of the center portion 31, which is shorter than the effective radius $R_0$ of the compound semiconductor substrate 40, the compound semiconductor substrate 40 is placed on the substrate holder 30 without contacting the top surface of the center portion 31*b*. Consequently, similar to the case of the protrusion-shaped support portions 32 shown in FIG. 3, the contact area between the compound semiconductor substrate 40 and the substrate holder 30 is reduced, and thereby thermal conduction between the compound semiconductor substrate 40 and the substrate holder 30 is suppressed. Moreover, fluctuations in temperature in the vicinity of the contact portion caused by fluctuations in the contact state between the compound semiconductor substrate 40 and the substrate holder 30 are suppressed.

In addition, by configuring the ring-shaped support portion 32L with a low thermal conduction material and providing the groove parts 322Lo and 322Li on the outer circumferential side and the inner circumferential side of the support portion 32L, thermal conduction between the compound semiconductor substrate 40 and the substrate holder 30 in the vicinity of the support portion 32L is suppressed.

Further, in the exemplary embodiment, the support portion 32L may be formed separately from the main body portion 31 of the substrate holder 30. For example, the ring-shaped support portion 32L may be set in the main body portion 31. In this case, division of the support portion 32L and the main body portion 31 reduces thermal conductivity, to further suppress thermal conduction between the compound semiconductor substrate 40 and the substrate holder 30. In this case, as a material constituting the support portion 32L, a material similar to that in the case of the above-described protrusion-shaped support portions 32 is provided.

Next, the raw material gas used in the MOCVD apparatus 1 will be described.

<Raw Material Gas>

In the exemplary embodiment, by use of the MOCVD apparatus 1, a group III nitride semiconductor layer is further formed on the compound semiconductor substrate 40 in which a compound semiconductor layer having an arbitrary composition has been formed in advance on a substrate 110

(refer to FIG. 5) made of sapphire (sapphire substrate (c-plane)). As a raw material, organic metal containing a group III element and ammonia $NH_3$ containing nitrogen are used. Since the organic metal is mainly a liquid feedstock, bubbling is performed on the organic metal in a liquid state with nitrogen $N_2$ or hydrogen $H_2$, and a metal-organic gas MO generated by mixing the obtained nitrogen $N_2$, hydrogen $H_2$ and the organic metal is supplied as the raw material gas. In the exemplary embodiment, the metal-organic gas MO and ammonia $NH_3$ are supplied via the supply tube 13.

As the organic metal, for example: an organic gallium compound, such as trimethyl gallium (TMG) and triethyl gallium (TEG); an organic aluminum compound such as trimethyl aluminum (TMA) and triethyl aluminum (TEA); and an organic indium compound such as trimethyl indium (TMI) and triethyl indium (TEI) are provided.

As a raw material of an n-type dopant, for example: a silane compound such as monosilane ($SiH_4$) and disilane ($Si_2H_6$); and a germanium compound such as germane gas ($G_eH_4$), tetramethyl germanium (($CH_3$)$_4$Ge) and tetraethyl germanium (($C_2H_5$)$_4$Ge) are provided.

As a raw material of a p-type dopant, for example, an organic magnesium compound such as bis(cyclopentadienyl) magnesium ($Cp_2Mg$) and bis(ethylcyclopentadienyl)magnesium ($EtCp_2Mg$) is provided.

Next, the laminated semiconductor wafer manufactured by using the MOCVD apparatus 1 will be described.

<Laminated Semiconductor Wafer>

Figure 5:
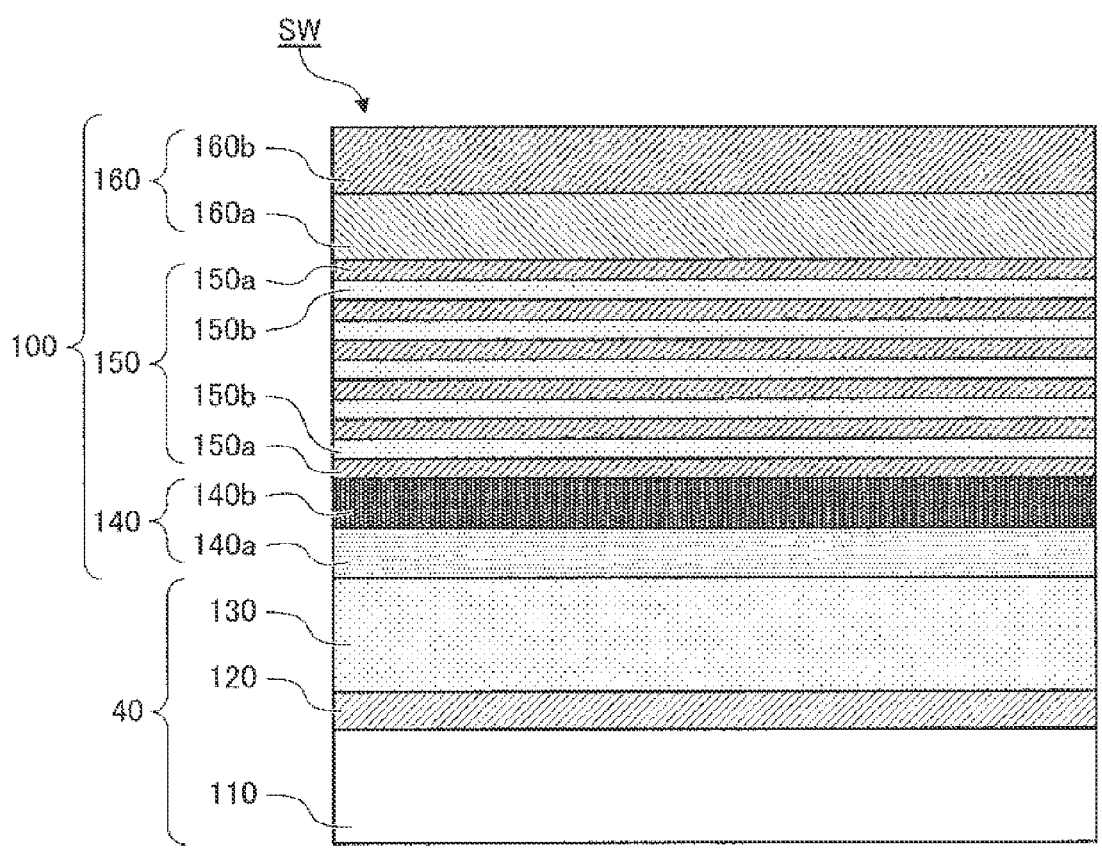
FIG. 5 is an example of a cross-sectional view of a laminated semiconductor wafer manufactured by using the MOCVD apparatus.

FIG. 5 shows an example of a cross-sectional view of the laminated semiconductor wafer SW manufactured by using the MOCVD apparatus 1. A compound semiconductor for constituting the laminated semiconductor wafer SW is not particularly limited, and for example, a group III-V compound semiconductor, a group II-VI compound semiconductor, a group IV-IV compound semiconductor and the like are provided. In the exemplary embodiment, the group III-V compound semiconductor is preferred, and a group III nitride semiconductor is more preferred. Hereinafter, description will be given by taking the laminated semiconductor wafer SW having the group III nitride semiconductor as an example. Especially, a light emitting element in which growth temperature has a large effect on characteristics thereof will be shown.

The laminated semiconductor wafer SW includes: the substrate 110; an intermediate layer 120 formed on the substrate 110; and a base layer 130, an n-type semiconductor layer 140, a light emitting layer 150 and a p-type semiconductor layer 160 sequentially laminated on the intermediate layer 120. In the exemplary embodiment, the substrate 110, the intermediate layer 120 and the base layer 130 that are sequentially laminated are referred to as the compound semiconductor substrate 40.

The n-type semiconductor layer 140 includes an n-type contact layer 140a provided on the base layer 130 side and an n-type cladding layer 140b provided on the light emitting layer 150 side. The light emitting layer 150 has a structure in which barrier layers 150a and well layers 150b are alternately laminated to sandwich one well layer 150b by two barrier layers 150a. The p-type semiconductor layer 160 includes a p-type cladding layer 160a provided on the light emitting layer 150 side and a p-type contact layer 160b provided at an uppermost layer. In the following description, the n-type semiconductor layer 140, the light emitting layer 150 and the p-type semiconductor layer 160 are collectively referred to as a compound semiconductor layer 100.

Hereinafter, a configuration of the laminated semiconductor wafer SW will be described.

(Substrate 110)

The substrate 110 is configured with a material different from the group III nitride semiconductor, and the group III nitride semiconductor crystal is epitaxially grown on the substrate 110. As a material for constituting the substrate 110, for example, sapphire, carbonized silicon (silicon-carbide: SiC), silicon, zinc oxide, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodium-gallium oxide, lanthanum-strontium-aluminum-tantalum oxide, strontium-titanium oxide, titanium oxide, hafnium, tungsten, molybdenum and the like can be provided. Among these, sapphire and carbonized silicon are preferable. In the exemplary embodiment, sapphire is used as the substrate 110. The surface of the substrate 110 is desirably processed with, for example, mirror finish or asperity finish.

(Intermediate Layer 120)

Since the substrate 110 is configured with a material different from the group III nitride semiconductor, it is preferable to provide the intermediate layer 120 that exerts a buffering function on the substrate 110. In a case where the intermediate layer 120 having a single crystal structure is formed on the substrate 110, the buffering function of the intermediate layer 120 effectively works, and thereby the base layer 130 formed on the intermediate layer 120 and the compound semiconductor layer 100 become crystal films having good crystallinity. The intermediate layer 120 preferably contains Al, and especially preferably, contains AlN, which is the group III nitride semiconductor.

(Base Layer 130)

As a material used for the base layer 130, the group III nitride semiconductor containing Ga (GaN-based compound semiconductor) is used. In particular, AlGaN and GaN are preferred. It should be noted that, in this specification, AlGaN, GaInN and the like are described with the compositional ratio of each element being omitted in some cases.

The film thickness of the base layer 130 is 0.1 µm or more, preferably 0.5 µm or more, and further preferably 1 µm or more.

(N-Type Semiconductor Layer 140)

The n-type semiconductor layer 140 is configured with the n-type contact layer 140a and the n-type cladding layer 140b. As the n-type contact layer 140a, similar to the base layer 130, the GaN-based compound semiconductor is used. It is preferable that the gallium-nitride-based compound semiconductor constituting the base layer 130 and the n-type contact layer 140a has the same composition, and it is preferable to set total film thickness of these in the range of 0.1 µm to 20 µm, preferably in the range of 0.5 µm to 15 µm, and further preferably in the range of 1 µm to 12 µm.

The n-type cladding layer 140b is formed by AlGaN, GaN, GaInN or the like. The hetero junction of these structures or the superlattice structure in which the layer is laminated plural times may also be employed. In the case where GaInN is employed, the band gap thereof is preferably larger than that of GaInN of the light emitting layer 150. The thickness of the n-type cladding layer 140b is preferably in the range of 5 nm to 500 nm, and more preferably in the range of 5 nm to 100 nm.

(Light Emitting Layer 150)

In the light emitting layer 150, the barrier layers 150a made of the gallium nitride-based compound semiconductor and the well layers 150b made of the gallium nitride-based compound semiconductor containing indium are alternately laminated in a repeated manner, and in such an order in which the barrier layers 150a is provided to face each of the n-type semiconductor layer 140 and the p-type semiconductor layer 160. In the exemplary embodiment, the light emitting layer 150 has a configuration in which six layers of the barrier layers 150a and five layers of the well layers 150b are alternately laminated in a repeated manner.

For the well layer 150b, as the gallium nitride-based compound semiconductor including indium, a gallium indium nitride such as $Ga_{1-s}In_sN$ ($0 < s < 0.4$) can be used.

Moreover, as the barrier layer 150a, a gallium nitride-based compound semiconductor, such as $Al_cGa_{1-c}N$ ($0 \le c \le 0.3$), which has a larger band gap energy than that of the well layer 150b made of the gallium nitride-based compound semiconductor including indium can be preferably used.

(P-Type Semiconductor Layer 160)

The p-type semiconductor layer 160 is constituted by the p-type cladding layer 160a and the p-type contact layer 160b. As the p-type cladding layer 160a, $Al_dGa_{1-d}N$ ($0 < d \le 0.4$) is preferable. The thickness of the p-type cladding layer 160a is preferably in a range of 1 nm to 400 nm, and more preferably in a range of 5 nm to 100 nm.

As the p-type contact layer 160b, a gallium nitride-based compound semiconductor layer including at least $Al_cGa_{1-c}N$ ($0 \le e < 0.5$) may be provided. The thickness of the p-type contact layer 160b is not particularly limited; however, it is preferably in a range of 10 nm to 500 nm, and more preferably in a range of 50 nm to 200 nm.

Here, the compound semiconductor substrate 40 is manufactured as follows. First, the substrate 110 made of sapphire with a predetermined diameter and thickness is set in a not-shown sputtering device. Then, by the sputtering device, the intermediate layer 120 made of the group III nitride semiconductor is formed on the substrate 110 by activating a gas containing a group V element and a metal material with plasma, and reacting them. Subsequently, the substrate 110 on which the intermediate layer 120 is formed is set in the MOCVD apparatus 1 shown in FIG. 1. Specifically, each substrate 110 is set on each substrate holder 30 so that the intermediate layer 120 faces outside, and each substrate holder 30 on which each substrate 110 is set is arranged on each recessed portion provided on the support body 20 so that the intermediate layer 120 faces upward. Thereafter, the base layer 130 is formed on the intermediate layer 120 by use of the MOCVD apparatus 1 to obtain the compound semiconductor substrate 40.

Next, a light emitting element chip LC obtained from the laminated semiconductor wafer SW will be described.

Figure 6:
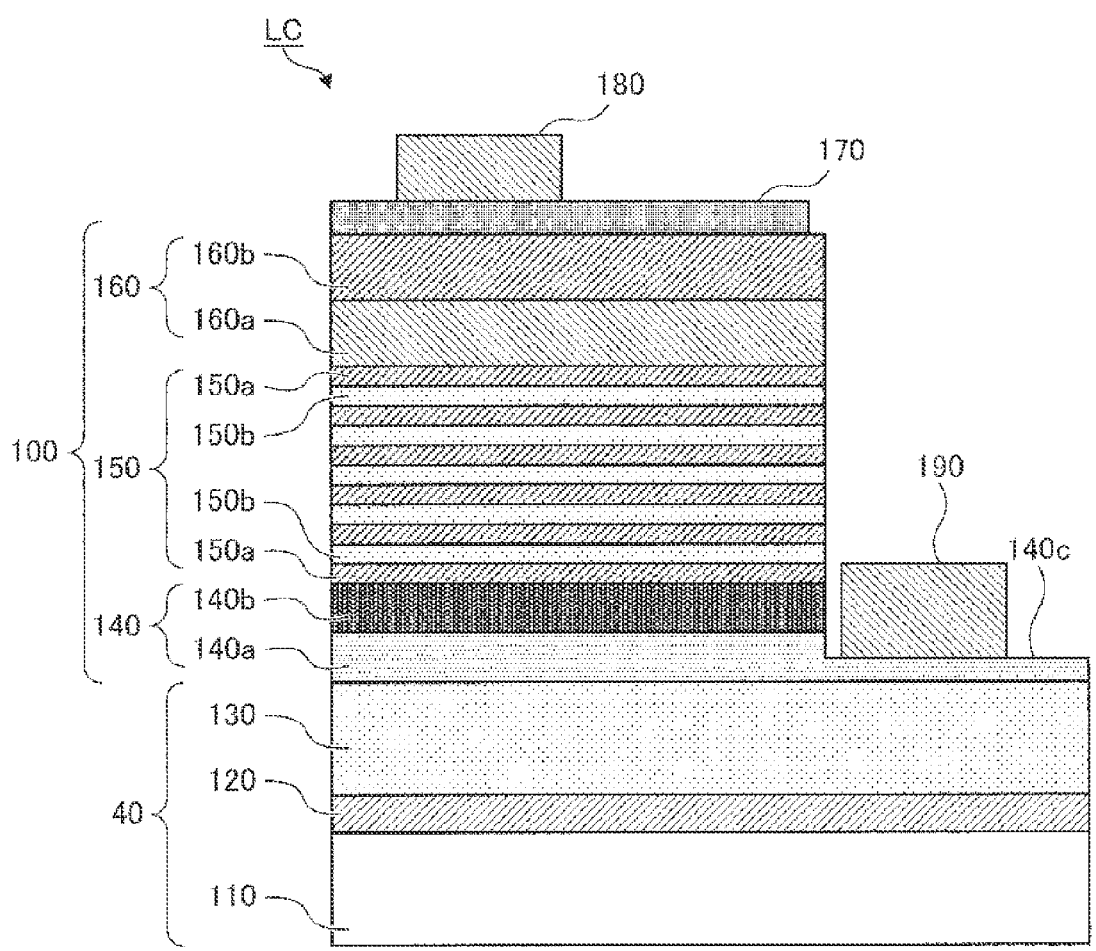
FIG. 6 is an example of a cross-sectional view of a light emitting element chip obtained by performing a further process on the laminated semiconductor wafer.

FIG. 6 shows a cross-sectional view of the light emitting element chip LC obtained by performing a further process on the laminated semiconductor wafer SW.

In the light emitting element chip LC, a transparent anode 170 is laminated on the p-type contact layer 160b of the p-type semiconductor layer 160, and an anode bonding pad 180 is further formed thereon, and a cathode bonding pad 190 is laminated on an exposed region 140c formed on the n-type contact layer 140a of the n-type semiconductor layer 140.

Hereinafter, a configuration of the light emitting element chip LC will be described.

(Transparent Anode 170)

As a material constituting the transparent anode 170, for example, conventionally-known materials such as ITO ($In_2O_3$—$SnO_2$), AZO (ZnO—$Al_2O_3$), IZO ($In_2O_3$—ZnO), and GZO (ZnO—$Ga_2O_3$) may be provided. Moreover, the structure of the transparent anode 170 is not particularly limited, and any conventionally-known structure can be employed. The transparent anode 170 may be formed to cover the almost entire surface of the p-type semiconductor layer 160 and may also be formed in a lattice shape or in a tree shape.

(Anode Bonding Pad 180)

The anode bonding pad 180 as an electrode formed on the transparent anode 170 is constituted by, for example, conventionally-known materials such as Au, Al, Ti, V, Cr, Mn, Co, Zn, Ge, Zr, Nb, Mo, Ru, Ta, Ni and Cu. The structure of the anode bonding pad 180 is not particularly limited and any conventionally-known structure may be employed. The thickness of the anode bonding pad 180 is, for example, in the range of 100 nm to 2000 nm, and preferably in the range of 300 nm to 1000 nm.

(Cathode Bonding Pad 190)

In the compound semiconductor layer 100 (the n-type semiconductor layer 140, the light emitting layer 150 and the p-type semiconductor layer 160) formed on the intermediate layer 120 and the base layer 130 which are formed on the substrate 110, the cathode bonding pad 190 is formed to contact the n-type contact layer 140a of the n-type semiconductor layer 140. When the cathode bonding pad 190 is formed, a part of each of the p-type semiconductor layer 160, the light emitting layer 150, and the n-type semiconductor layer 140 is removed to form the exposed region 140c of the n-type contact layer 140a, and then the cathode bonding pad 190 is formed thereon. As a material of the cathode bonding pad 190, the composition and structure same as those of the anode bonding pad 180 may be used, cathodes of various compositions and structures are widely known, and these widely-known cathodes may be provided without any limitation by any well-known method in this technical field.

Next, a method for manufacturing the laminated semiconductor wafer SW will be described.

(Method for Manufacturing Laminated Semiconductor Wafer SW)

In the exemplary embodiment, the intermediate layer 120 is formed on the substrate 110 with a material which has been activated with plasma and reacted by use of a sputtering method. Here, the group V element is nitrogen, a ratio of nitrogen content in a gas when the intermediate layer 120 is formed is set in the range of 50 vol % to 99 vol % or less, and the intermediate layer 120 is formed as a single crystal structure. Next, on the intermediate layer 120, the base layer 130 is formed by the MOCVD method or the sputtering method, to thereby form the compound semiconductor substrate 40.

Subsequently, with the compound semiconductor substrate 40 thus formed, manufacture is performed in accordance with the following procedures by using the MOCVD apparatus 1.

First, on the center portion 31b of each of six substrate holders 30, one compound semiconductor substrate 40 is placed and the base layer 130 is exposed to the outside. Subsequently, six substrate holders 30 are set in the six recessed portions provided in the support body 20 of the MOCVD apparatus 1. Thereafter, the lid portion 12 to which the protecting member 60 is attached is closed to bring the container portion 11 into intimate contact with the lid portion 12.

Next, via the gas supply port, supply of nitrogen $N_2$ toward the bottom portion of each recessed portion of the support body 20 is started, to thereby start rotation of the shaft 21. With this, the support body 20 rotates in the direction of arrow A, and six substrate holders 30 attached to the support body 20 rotate in the direction of arrow B.

Moreover, electrical supply to the coil of the heater portion 50 is started, and thereby the support body 20 is heated by electromagnetic induction by the electric current passing through the heater portion 50, and accordingly, six substrate holders 30 supported by the support body 20 and the compound semiconductor substrate 40 held by each substrate holder 30 are heated to a predetermined temperature.

The compound semiconductor substrate 40 is heated to the range of 700° C. to 1200° C. Moreover, the temperature of the compound semiconductor substrate 40 is adjusted to a value suitable for crystal growth of each thereof.

In the reaction chamber of the MOCVD apparatus 1, the metal-organic gas MO and ammonia $NH_3$ for the n-type contact layer 140a supplied from the supply tube 13 are decomposed in the vicinity of the compound semiconductor substrate 40 to be heated, and the group III nitride semiconductor for the n-type contact layer 140a is grown on the compound semiconductor substrate 40. At this time, crystal of the group III nitride semiconductor for the n-type contact layer 140a is epitaxially grown on the base layer 130 of the compound semiconductor substrate 40 heated to a predetermined temperature.

When formation of the n-type contact layer 140a is completed, in the reaction chamber of the MOCVD apparatus 1, the metal-organic gas MO and ammonia $NH_3$ for the n-type cladding layer 140b supplied from the supply tube 13 are decomposed in the vicinity of the compound semiconductor substrate 40 to be heated, and the group III nitride semiconductor for the n-type cladding layer 140b is grown on the n-type contact layer 140a. At this time, crystal of the group III nitride semiconductor for the n-type cladding layer 140b is epitaxially grown on the n-type contact layer 140a formed on the compound semiconductor substrate 40 heated to a predetermined temperature.

Thereafter, by sequentially changing the metal-organic gas MO supplied to the reaction chamber, on the n-type cladding layer 140b formed on the compound semiconductor substrate 40, the light emitting layer 150 that includes plural barrier layers 150a and plural well layers 150b, and the p-type semiconductor layer 160 including the p-type cladding layer 160a and the p-type contact layer 160b are sequentially formed. Through such procedures, the laminated semiconductor wafer SW can be obtained.

Next, a method for manufacturing the light emitting element chip LC will be described.

<Method for Manufacturing Light Emitting Element Chip LC>

When the above-described layer forming process is completed, the substrate holders 30 are taken out from the support body 20, and further, the laminated semiconductor wafers SW are removed from the substrate holders 30. Then, the transparent anode 170 is laminated on the p-type semiconductor layer 160 of the laminated semiconductor wafer SW, and the anode bonding pad 180 is formed thereon. Moreover, the exposed region 140c is formed on the n-type contact layer 140 by using etching or the like, to thereby provide the cathode bonding pad 190 on the exposed region 140c. Thereafter, a surface of the substrate 110 opposite to the forming surface of the intermediate layer 120 is ground and polished to have a predetermined thickness. Then, the light emitting element chip LC is obtained by cutting the wafer in which the thickness of the substrate 110 is adjusted into squares of 350 µm per side.

As described in detail above, in the exemplary embodiment, by using the support portion 32 that supports the compound semiconductor substrate 40 at three points while epitaxially growing the compound semiconductor layer 100 on the compound semiconductor substrate 40, the compound semiconductor substrate 40 is placed without contacting the top surface of the substrate holder 30. Consequently, the contact area between the compound semiconductor substrate 40 and the substrate holder 30 is reduced, and therefore, it becomes possible to reduce (suppress) local temperature changes in the compound semiconductor substrate 40.

EXAMPLES

Hereinafter, the present invention will be described in further detail based on the Examples. However, the present invention is not limited to the following Examples as long as the scope of the gist thereof is not exceeded.

In Examples, methods for evaluating temperature measurement of the epitaxial crystal growth surface of the sapphire substrate and the distribution of the light emission wavelength (wavelength distribution o) obtained from the compound semiconductor wafer are as follows.

(1) Temperature Measurement of Epitaxial Crystal Growth Surface of Sapphire Substrate The temperature of the epitaxial crystal growth surface of the sapphire substrate was measured with a radiation thermometer utilizing light in a wavelength area of 8 µm to 14 µm. The measuring method was such that the temperature on a crossing path of the wafer that rotates and revolves under a measurement port in the course of growing the light emitting layer was measured, and measured values were averaged for each distance from the center of the substrate.

(2) Distribution of Light Emission Wavelength Obtained from Compound Semiconductor Wafer (Standard Deviation σ)

The wavelength distribution of the light emission wavelength was measured by using a PL mapper (RPM-Σ manufactured by Accent Optical Technologies, Inc.)

Example 1

<Preparation of Laminated Semiconductor Wafer I>

A laminated semiconductor wafer I was prepared by using substrate 110 made of sapphire (front surface: c-plane) with the effective radius ($R_0$) of 50 mm and the thickness of 0.91 mm, and by epitaxially growing the compound semiconductor layer 100 on the substrate 110 by use of the MOCVD apparatus 1 shown in FIG. 1.

The substrate holder 30 of the MOCVD apparatus 1 had the configuration including the three protrusion-shaped support portions 32 shown in FIG. 3A. The three protrusion-shaped support portions 32 are arranged so as to maintain substantially the same intervals with each other along the circumference of the circle having the radius $R_1$ (35 mm) from the center of the top surface of the main body portion 31.

The material constituting the support portions 32 is, similar to the substrate 110, sapphire (front surface: c-plane).

The shape of the support portion 32 has a diameter D=1 mmφ and a height H=0.3 mm. Here, the contact area between the substrate 110 and the support portions 32 is about 0.03% of the area of the substrate 110. The shape of the groove part 322 has a depth L of 1 mm and the width W of 2 mm. The material of the main body portion 31 is SiC-coated graphite.

First, the compound semiconductor substrate 40 was prepared in the way where, on the substrate 110 made of sapphire, the intermediate layer 120 made of AN with a thickness of 0.05 µm was formed by the sputtering method, and the base layer 130 made of undoped GaN with a thickness of 8 µm and the n-type contact layer 140a made of Si-doped GaN with a thickness of 2 µm were formed thereon. Next, the compound semiconductor substrate 40 was placed on the substrate holder 30 including the three protrusion-shaped support portions 32, and the n-type cladding layer 140b made of $In_{0.1}Ga_{0.9}N$ with a thickness of 250 nm was formed by the MOCVD, then the barrier layer 150a made of Si-doped GaN with a thickness of 16 nm and the well layer 150b made of $In_{0.2}Ga_{0.8}N$ with a thickness of 2.5 nm were laminated five times, and finally the barrier layer 150a was provided, thereby forming the light emitting layer 150 having a multiple quantum well structure.

Further, on the light emitting layer 150, the p-type cladding layer 160a made of Mg-doped $Al_{0.07}Ga_{0.93}N$ with a thickness of 10 nm and the p-type contact layer 160b made of Mg-doped GaN with a thickness of 150 nm were formed in this order. It should be noted that lamination of the gallium nitride-based compound semiconductor layers was performed by the MOCVD method under normal conditions that were well known in this technical field.

Thereafter, the wavelength distribution was obtained by measuring the light emission wavelength (nm) obtained from the laminated semiconductor wafer I by the above-described PL mapper (RPM-Σ manufactured by Accent Optical Technologies, Inc.)

In Table 1, results of the position of the radius R (mm) from the center of the main body portion 31 of the substrate holder 30 used in the MOCVD apparatus 1, the temperature (° C.) of the epitaxial crystal growth surface of the substrate 110 at the position of the radius R (mm), and the light emission wavelength (nm) averaged at the position of the radius R (mm) are shown. On the basis of these results, the temperature distribution (difference between the highest temperature and the lowest temperature ΔT: ° C.) of the epitaxial growth surface and the distribution of the light emission wavelength (standard deviation σ: nm) in the plane of the wafer in which the light emitting layer 150 is formed (in the plane of the laminated semiconductor wafer) were obtained.

Comparative Example 1

<Preparation of Laminated Semiconductor Wafer II>

A laminated semiconductor wafer II was prepared in the way similar to Example 1. As the substrate holder 30 of the MOCVD apparatus 1, the one that includes the main body portion 31 with a flatly-formed center portion 31b was used, and the substrate 110 made of sapphire was directly placed on the center portion 31b of the main body portion 31, and other than these, the compound semiconductor layer 100 was epitaxially grown on the substrate 110 under the conditions same as those in Example 1, to thereby prepare the laminated semiconductor wafer II. Here, the contact area between the substrate 110 and the center portion 31b of the main body portion 31 is, though incapable of exactly grasping due to an effect of warping of the substrate 110, of the order of 80% to 100% of the area of the substrate 110.

Thereafter, regarding the compound semiconductor wafer II, the wavelength distribution was obtained by measuring the light emission wavelength (nm) obtained from the laminated semiconductor wafer II by the PL mapper (RPM-Σ manufactured by Accent Optical Technologies, Inc.)

In Table 1, the position of the radius R (mm) from the center of the main body portion 31 of the substrate holder 30 used in the MOCVD apparatus 1, the temperature (° C.) of the epitaxial crystal growth surface of the substrate 110 at the position of the radius R (mm), and the results of the light emission wavelength (nm) averaged at the position of the radius R (mm) are shown. Moreover, on the basis of these results, the temperature distribution (difference between the highest temperature and the lowest temperature ΔT: ° C.) of the epitaxial growth surface and the distribution of the light emission wavelength (standard deviation σ: nm) in the plane of the wafer in which the light emitting layer 150 is formed (in the plane of the laminated semiconductor wafer) were obtained.

TABLE 1

| Measurement | Example 1 | | Comparative Example 1 | |
| --- | --- | --- | --- | --- |
| Position R (mm) | Temperature (° C.) | Wavelength (nm) | Temperature (° C.) | Wavelength (nm) |
| 1 | 724.70 | 449.15 | 726.36 | 439.11 |
| 3 | 724.73 | 449.14 | 726.32 | 439.56 |
| 5 | 724.76 | 449.05 | 726.25 | 439.70 |
| 7 | 724.81 | 448.97 | 726.13 | 439.90 |
| 9 | 724.87 | 448.89 | 726.01 | 440.22 |
| 11 | 724.88 | 448.81 | 725.87 | 440.60 |
| 13 | 724.91 | 448.88 | 725.72 | 440.92 |
| 15 | 724.86 | 449.01 | 725.59 | 441.26 |
| 17 | 724.87 | 449.14 | 725.49 | 441.53 |
| 19 | 724.84 | 449.27 | 725.44 | 441.74 |
| 21 | 724.85 | 449.37 | 725.44 | 441.84 |
| 23 | 724.84 | 449.49 | 725.45 | 441.88 |
| 25 | 724.85 | 449.58 | 725.51 | 441.83 |
| 27 | 724.82 | 449.65 | 725.64 | 441.72 |
| 29 | 724.90 | 449.71 | 725.77 | 441.49 |
| 31 | 724.94 | 449.68 | 725.99 | 441.22 |
| 33 | 725.01 | 449.52 | 726.27 | 440.72 |
| 35 | 725.04 | 449.57 | 726.52 | 440.19 |
| 37 | 725.00 | 449.54 | 726.83 | 439.48 |
| 39 | 724.87 | 449.53 | 727.19 | 438.53 |
| 41 | 724.78 | 449.52 | 727.53 | 437.36 |
| 43 | 724.54 | 449.49 | 727.94 | 435.99 |
| 45 | 724.34 | 449.71 | 728.32 | 434.50 |
| | ΔT = 0.70° C. | σ = 0.93 nm | ΔT = 2.88° C. | σ = 3.82 nm |

In the table, σ represents the standard deviation of wavelength on the whole surface of the wafer.

Figure 7:
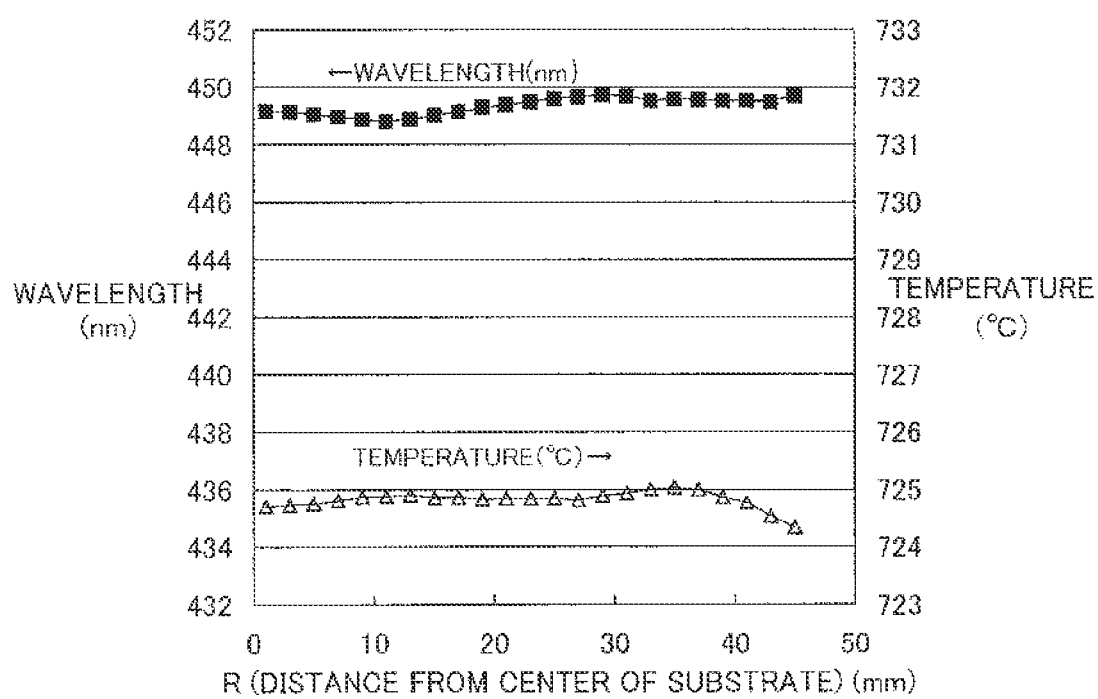
FIG. 7 is a graph showing results of Example 1.
Figure 8:
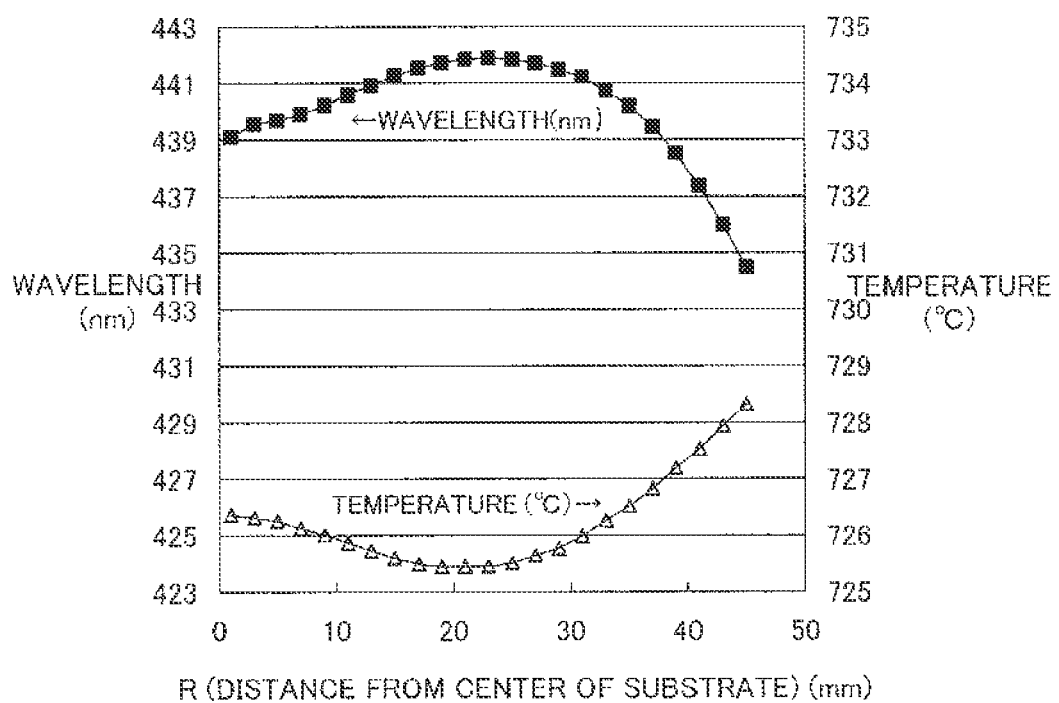
FIG. 8 is a graph showing results of Comparative Example 1.

FIG. 7 is a graph showing the results of Example 1. FIG. 8 is a graph showing the results of Comparative Example 1. In the graphs shown in FIGS. 7 and 8, the horizontal axis indicates a measurement position R (at the position of the radius R (mm) from the center of the main body portion 31 of the substrate holder 30) at which the temperature and the light emission wavelength were measured, the left-side vertical axis indicates the light emission wavelength (nm) averaged at the position of the radius R (mm), and the right-side vertical axis indicates the temperature (° C.) of the epitaxial crystal growth surface of the substrate 110.

From the results of Table 1 and FIG. 7, it can be seen that, in the laminated semiconductor wafer I (Example 1) prepared by placing the substrate 110 made of sapphire on the three support portions 32 arranged at the positions of the lengths from the center of the top surface of the main body portion 31 shorter than the effective radius $R_0$ of the substrate 110, and epitaxially growing the compound semiconductor layer 100 on the substrate 110 in this state, the temperature distribution of the epitaxial growth surface of the crystal is suppressed (ΔT=0.70° C.), and the distribution of the light emission wavelength in the plane of the wafer in which the light emitting layer 150 was formed (in the plane of the laminated semiconductor wafer) is reduced (σ=0.93 nm).

On the other hand, from the results of Table 1 and FIG. 8, it can be seen that, in the laminated semiconductor wafer II (Comparative Example 1) prepared by directly placing the substrate 110 made of sapphire on the flatly-formed substrate holder 30, and epitaxially growing the compound semiconductor layer 100 on the substrate 110 in this state, the temperature distribution of the epitaxial growth surface of the crystal is wide (ΔT=2.88° C.), and the distribution of the light emission wavelength in the plane of the wafer in which the light emitting layer 150 was formed (in the plane of the laminated semiconductor wafer) is increased ($\sigma$=3.82 nm).

Example 2

<Preparation of Laminated Semiconductor Wafer III>

A laminated semiconductor wafer III was prepared by using substrate 110 made of sapphire (front surface: c-plane) with the effective radius ($R_0$) of 75 mm and the thickness of 1 mm, and by epitaxially growing the compound semiconductor layer 100 on the substrate 110 by use of the MOCVD apparatus 1 shown in FIG. 1.

The substrate holder 30 of the MOCVD apparatus 1 had the configuration including the three protrusion-shaped support portions 32 shown in FIG. 3A. The three protrusion-shaped support portions 32 are arranged so as to maintain substantially the same intervals with each other along the circumference of the circle having the radius $R_1$ (55 mm) from the center of the top surface of the main body portion 31.

The material constituting the support portions 32 is, similar to the substrate 110, sapphire. The shape of the protrusion-shaped support portion 32 has a diameter D=0.8 mm □ and a height H=0.4 mm. Here, the contact area between the substrate 110 and the support portions 32 is about 0.01% of the area of the substrate 110. The shape of the groove part 322 has a difference in level L of 0.9 mm and the width W of 1.8 mm. The material of the main body portion 31 is SiC-coated graphite.

As a result of measuring the position of the radius R (mm) from the center of the main body portion 31 of the substrate holder 30 used in the MOCVD apparatus 1, the temperature (° C.) of the epitaxial crystal growth surface of the substrate 110 at the position of the radius R (mm), and the light emission wavelength (nm) averaged at the position of the radius R (mm) in the procedures similar to those in Example 1, the temperature distribution of the epitaxial growth surface of the crystal was ($\Delta T$)=1.1° C., and the distribution of the light emission wavelength in the plane of the wafer in which the light emitting layer 150 was formed (in the plane of the laminated semiconductor wafer) was ($\sigma$)=1.4 nm, which is a good result. Here, the reason that the temperature distribution and the distribution of the light emission wavelength are wider when using the substrate with larger effective radius is mainly that the warp of wafer during growth increases as the diameter of the substrate increases.

In the exemplary embodiment, if the substrate 110 made of sapphire is placed on the support portions 32 arranged on the circumference of the circle C with a radius $R_1$ ($\approx R_0/\sqrt{2}$) from the center of the top surface of the main body portion 31, though warp of the substrate 110 is changed, temperature change averaged over the epitaxial growth surface of the crystal is suppressed, and thereby deviation from the target wavelength of the light emission wavelength in the plane of the wafer in which the light emitting layer 150 is formed (in the plane of the laminated semiconductor wafer) is suppressed. This will be described based on a result of a simulation.

Figure 9:
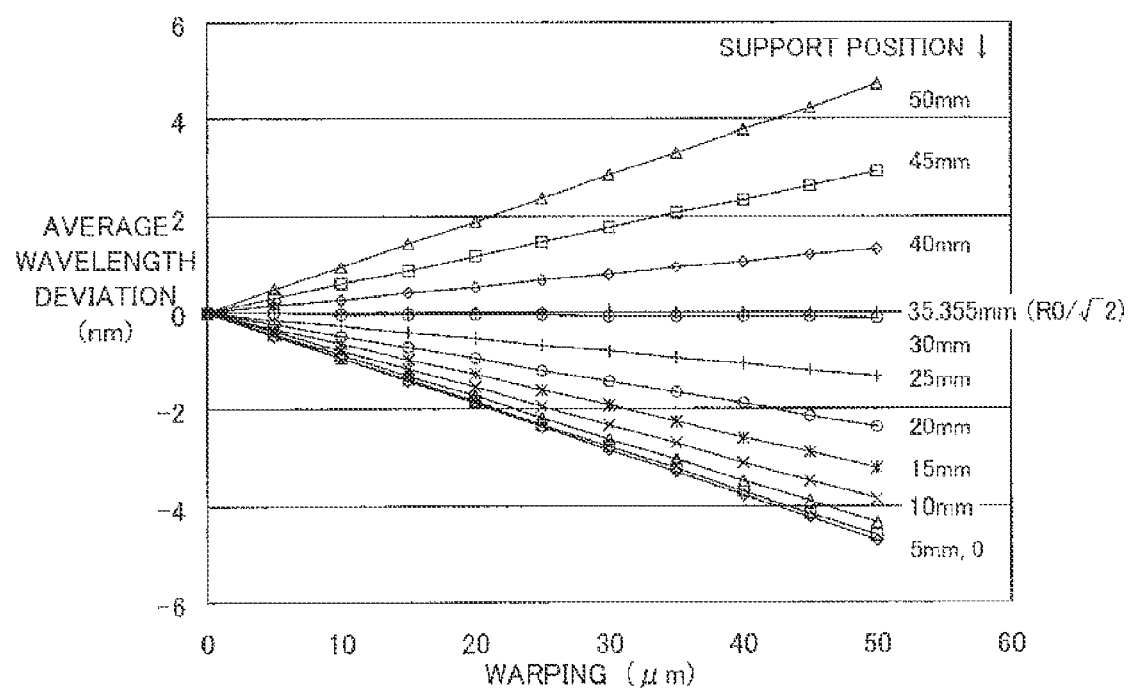
FIG. 9 is a graph illustrating a result of a simulation of deviation of in-plane averaged light emission wavelength on the substrate due to changes of warp of the substrate.

FIG. 9 is a graph illustrating a result of a simulation of deviation of in-plane averaged light emission wavelength on the substrate 110 due to changes of warp of the substrate 110. Here, the result of the simulated deviation of in-plane averaged light emission wavelength (vertical axis: unit is nm) (averaged over the laminated semiconductor wafer) from the target wavelength versus the change of the warp of the wafer at growth temperature (horizontal axis: unit is nm), with various positions of the support portion 32 (support position: unit is nm) changing from the center of the top surface of the main body portion 31 toward the outer circumference, will be described. Here, the deviation of the averaged light emission wavelength from the target wavelength is regarded as average wavelength deviation (vertical axis).

As shown in FIG. 9, in the case where the position (support position) of the support portion 32 on which the substrate 110 with the effective radius of 50 mm (=$R_0$) is at 35.355 mm (=$R_0/\sqrt{2}$) from the center of the top surface of the main body portion 31, the obtained average wavelength deviation (vertical axis) of the in-plane averaged light emission wavelength over the wafer (in the plane of the laminated semiconductor wafer) maintains zero without suffering from the effect of the change of warping (horizontal axis), and thereby it is possible to suppress the deviation from the target light emission wavelength.

On the other hand, in the case where the position (support position) of the support portion 32 is closer to the outer circumference than the position of 35.355 mm (=$R_0/\sqrt{2}$) from the center of the top surface of the main body portion 31, the average wavelength deviation (vertical axis) of the light emission wavelength largely increases on the positive side with the increase of warping (horizontal axis). Moreover, in the case of being closer to the inner circumference than the position of 35.355 mm (=$R_0/\sqrt{2}$), the average wavelength deviation (vertical axis) of the light emission wavelength largely increases on the negative side with the increase of warping (horizontal axis). Here, the sign of the warp of the wafer is defined as positive when the center of the wafer of growing surface is higher than the edge of the wafer. Since it is considered that the light emission wavelength is the target wavelength in the vicinity of the support portion 32, the larger the deviation of the position of the support portion 32 from $R_0/\sqrt{2}$ is, the more remarkable the increase of the deviation of the in-plane averaged light emission wavelength from the target wavelength with the increase of the warp of the wafer at growth temperature in the plane of the wafer becomes.

REFERENCE SIGNS LIST

1 . . . MOCVD apparatus
10 . . . Reaction container
11 . . . Container portion
12 . . . Lid portion
20 . . . Support body
30 . . . Substrate holder
30a . . . Ring
31 . . . Main body portion
31a . . . Limb portion
31b . . . Center portion
31c . . . Ori-fla corresponding portion
32 . . . Support portion
321 . . . Protruding part
322, 322Lo, 322Li . . . Groove part
32L . . . Ring-shaped support portion
40 . . . Compound semiconductor substrate
50 . . . Heater portion
60 . . . Protecting member
90 . . . Monitoring device
100 . . . Compound semiconductor layer
110 . . . Substrate
120 . . . Intermediate layer
130 . . . Base layer
140 . . . N-type semiconductor layer
140a . . . N-type contact layer
140b . . . N-type cladding layer
150 . . . Light emitting layer
150a . . . Barrier layer 150b ... Well layer
160 ... P-type semiconductor layer
160a ... P-type cladding layer
160b ... P-type contact layer
170 ... Transparent anode
180 ... Anode bonding pad
190 ... Cathode bonding pad
SW ... Laminated semiconductor wafer
LC ... Light emitting element chip

The invention claimed is:

1. An apparatus for manufacturing a compound semiconductor that forms a layer of the compound semiconductor using a metal-organic chemical vapor deposition method, the apparatus comprising:
a reaction container;
a holder that is placed in the reaction container, on which a forming body is placed so that a forming surface of the forming body faces upward; and
a raw material supply port that supplies a raw material gas into the reaction container from outside,
wherein the holder includes:
a support portion that contacts a lower surface of the forming body at an inner side of an outer circumferential portion of the forming body at a position toward a center of a top surface of the holder and supports the forming body so that the top surface of the holder and the lower surface of the forming body maintain a predetermined space, and
the support portion is formed at a position between concentric circles with radii ($R_1$) of 0.7 to 0.73 times an effective radius $R_0$ of the forming body from the center of the top surface of the holder,
wherein a ring member is formed at an outer circumferential portion of the holder so that an inner side of the ring member and the outer circumferential portion of the forming body contact one another.

2. The apparatus for manufacturing a compound semiconductor according to claim 1, wherein the support portion includes protrusions provided at least at three points on the top surface of the holder.

3. The apparatus for manufacturing a compound semiconductor according to claim 2, wherein a groove part is formed around each of the protrusions provided on the top surface of the holder.

4. The apparatus for manufacturing a compound semiconductor according to claim 1, wherein a contact area between the support portion and the forming body is 1% or less of an area of the forming body.

5. The apparatus for manufacturing a compound semiconductor according to claim 1, wherein the support portion includes a ring shape formed on the top surface of the holder.

6. The apparatus for manufacturing a compound semiconductor according to claim 5, wherein a groove part is formed on each of an inner circumferential side and an outer circumferential side of the ring-shaped support portion provided on the top surface of the holder.

7. The apparatus for manufacturing a compound semiconductor according to claim 1, wherein the support portion is made of a material having a thermal conductivity of 10W/(m·K) or less at growth temperature.

8. The apparatus for manufacturing a compound semiconductor according to claim 1, wherein the support portion is made of one material selected from a group constituted by alumina ($Al_2O_3$), quartz glass ($SiO_2$), silicon nitride ($Si_3N_4$), zirconia ($ZrO_2$) and silicon carbide (SiC).

9. The apparatus for manufacturing a compound semiconductor according to claim 1, wherein the support portion is made of sapphire.

10. The apparatus for manufacturing a compound semiconductor according to claim 1, wherein the compound semiconductor is a group III nitride semiconductor.

11. The apparatus for manufacturing a compound semiconductor according to claim 1, wherein an inner side of the ring member of the holder and the outer circumferential portion of the forming body are in a surface to a surface contact with one another.

12. A method for manufacturing a compound semiconductor that forms layers of the compound semiconductor on a forming surface of a forming body in a reaction container by epitaxial growth using a metal-organic chemical vapor deposition method, the method for manufacturing a compound semiconductor comprising:
providing a support portion on a holder, which contacts a lower surface of the forming body at an inner side of an outer circumferential portion of the forming body at a position toward a center of a top surface of the holder and supports the forming body, so that the top surface of the holder and the lower surface of the forming body maintain a predetermined space, and placing the forming body so that the forming surface of the forming body faces upward and the lower surface of the forming body does not contact the top surface of the holder;
setting the holder on which the forming body is placed in the reaction container rotatably; and
supplying a raw material gas for the compound semiconductor into the reaction container in which the holder is set,
wherein the support portion is formed at a position between concentric circles with radii ($R_1$) of 0.7 to 0.73 times an effective radius $R_0$ of the forming body from the center of the top surface of the holder, and
a ring member is formed at an outer circumferential portion of the holder so that an inner side of the ring member and the outer circumferential portion of the forming body contact one another.

13. The method for manufacturing a compound semiconductor according to claim 12, wherein the forming body is placed on the support portion having protrusion shapes provided at least at three points between concentric circles with radii ($R_1$) of 0.7 to 0.73 times an effective radius $R_0$ of the forming body from the center of the top surface of the holder.

14. The method for manufacturing a compound semiconductor according to claim 12, wherein the forming body is heated to 700° C. or more to 1200° C. or less.

15. The method for manufacturing a compound semiconductor according to claim 12, wherein the compound semiconductor is a group III nitride semiconductor.

16. A compound semiconductor manufactured by the method for manufacturing a compound semiconductor according to claim 12.

* * * * *